(12) United States Patent
Balachandran

(10) Patent No.: US 8,004,444 B2
(45) Date of Patent: Aug. 23, 2011

(54) ADC CHOPPING TRANSCONDUCTOR HAVING TWO PAIRS OF CASCODE TRANSISTORS

(75) Inventor: Ganesh Balachandran, Sunnyvale, CA (US)

(73) Assignee: Texas Instruments Incorporated, Dallas TX ( * ) Notice: Subject to any disclaimer, the term of this patent is extended or adjusted under 35 U.S.C. 154(b) by 0 days.

(21) Appl. No.: 12/903,795

(22) Filed: Oct. 13, 2010

(65) Prior Publication Data

US 2011/0025402 A1 Feb. 3, 2011

Related U.S. Application Data

(62) Division of application No. 12/317,953, filed on Dec. 31, 2008, now Pat. No. 7,839,316.

(51) Int. Cl.
*H03M 1/12* (2006.01)

(52) U.S. Cl. ......................................... 341/155; 341/143

(58) Field of Classification Search .................. 341/110, 341/118, 139, 155, 172; 327/124, 307; 330/311, 330/255, 261, 310
See application file for complete search history.

(56) References Cited

U.S. PATENT DOCUMENTS 7,310,016 B2 * 12/2007 Chuang .............................. 330/9
7,385,443 B1 * 6/2008 Denison ............................ 330/9

* cited by examiner

*Primary Examiner* — Brian Young
(74) *Attorney, Agent, or Firm* — Lawrence J. Bassuk; W. James Brady; Frederick J. Telecky, Jr.

(57) ABSTRACT

A chopping transconductor includes an transconductor input stage coupled with input signals of the chopping transconductor; a chopping switch coupled with an output of the transconductor input stage, the chopping switch having a switch output; and a cascode transistor, wherein the switch output is coupled to an output of the chopping transconductor through the cascode transistor. The chopping transconductor may be used in an analog-to-digital converter to isolate chopping switches from junctions with quantization noise.

4 Claims, 3 Drawing Sheets

ADC CHOPPING TRANSCONDUCTOR HAVING TWO PAIRS OF CASCODE TRANSISTORS

This application is a divisional of prior application Ser. No. 12/317,953, filed Dec. 31, 2008, now U.S. Pat. No. 7,839,316, issued Nov. 23, 2010.

BACKGROUND

1. Field

The present invention relates generally to signal processing and, more particularly, to analog to digital conversion.

2. Description of Related Art

In many moderate bandwidth sigma-delta analog-to-digital converter (ADC) applications, flicker noise is a significant problem. Examples of such applications include audio and GSM which are economically significant markets. Flicker noise is noise that is characterized by a 1/f relationship such that lower frequencies tend to contribute more to the noise. This flicker noise problem is a significant issue with circuits fabricated with CMOS devices having a size of 45 nm and 65 nm.

In the past, some attempts have been made to reduce flicker noise and its effects. One approach has been to increase the devices sizes away from 45 nm. The result, however, is an ADC that is unattractively 2 to 4 times the size if flicker noise was not a problem. In addition to the unwanted size increase, parasitic capacitances also increase. To combat this, current consumption is necessarily increased to keep the parasitic poles from decreasing (it is known that low frequency parasitic poles cause instability within ADCs.)

Therefore, there remains, as yet an unfulfilled need for an ADC that reduces the impact of flicker noise but also provide a small device/circuit size and avoid impacting current and power consumption. One particular disadvantage of conventional chopping techniques is quantization noise folding, or aliasing, that can occur because of chopping at frequencies less than the ADC clock frequency. The lowest frequency at which chopping may be performed is determined, at least in part, by the flicker noise corner of the ADC. Different approaches to addressing this issue have been proposed. One technique may be to increase the number of quantization levels. However, this will also result in an increase in current and power consumption. Another technique would be to chop at a frequency above the Nyquist rate such as, for example $f_{chop} = f_{clk}$. However, this also results in increased power consumption and also the need for clock boosting circuits for the choppers in order to reduce switch resistance.

BRIEF SUMMARY

Embodiments of the present invention relate to a chopping transconductor that includes an transconductor input stage coupled with input signals of the chopping transconductor; a chopping switch coupled with an output of the transconductor input stage, the chopping switch having a switch output; and a cascode transistor, wherein the switch output is coupled to an output of the chopping transconductor through the cascode transistor. The chopping transconductor may be used in an analog-to-digital converter to isolate chopping switches from junctions with quantization noise.

It is understood that other embodiments of the present invention will become readily apparent to those skilled in the art from the following detailed description, wherein it is shown and described only various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF DRAWINGS

Various aspects of embodiments of the invention are illustrated by way of example, and not by way of limitation, in the accompanying drawings, wherein.

DETAILED DESCRIPTION

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention.

Figure 1A:
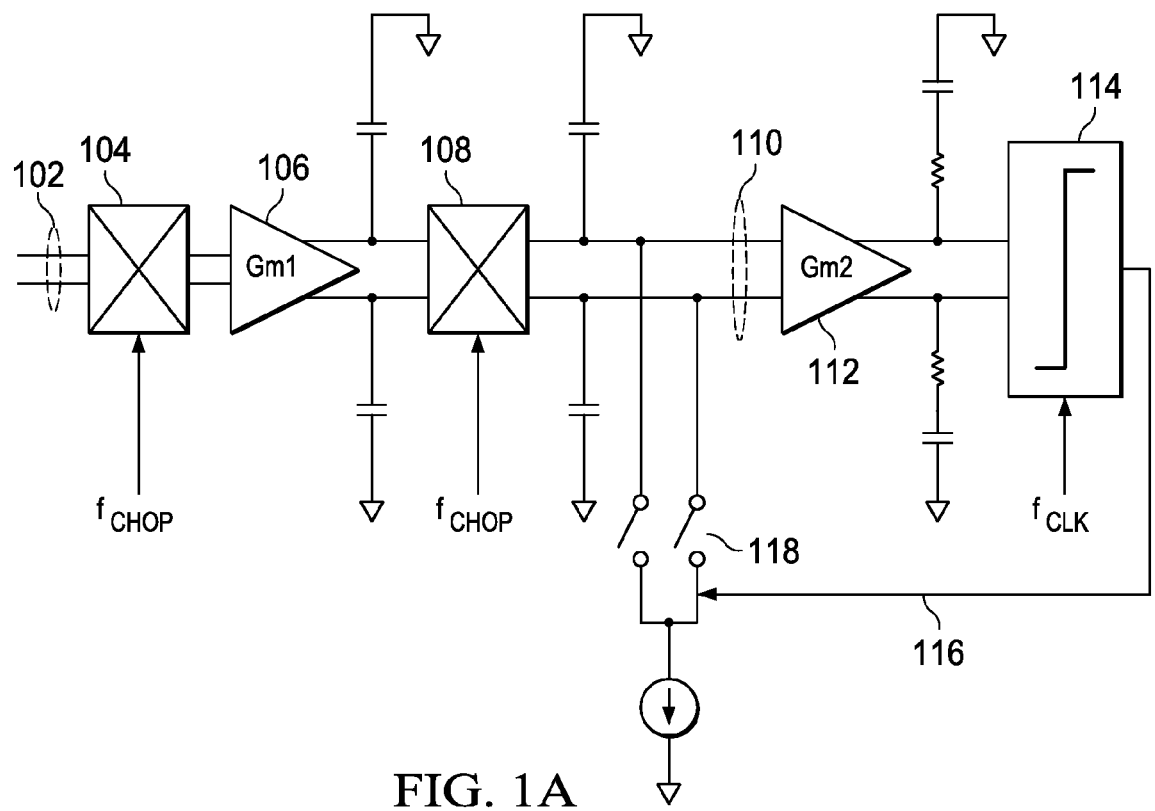
FIG. 1A depicts a related continuous-time sigma delta analog-to-digital converter.

FIG. 1A depicts a related analog-to-digital converter (ADC) that includes chopping switches. An analog signal 102 is acquired from any of a variety of known sources using well known techniques. Filtering and signal shaping can take place during signal acquisition using methods and techniques known to one of ordinary skill. The analog signal may, for example, have a bandwidth of between 0 to 1 MHZ. This frequency range can be more or less depending on each specific application contemplated. For example, a bandwidth of about 0 to 100 kHz is contemplated for certain voice-related applications. Within the description below specific values for different components and circuitry may be provided. One of ordinary skill will recognize that these specific values are provided so that a concrete example may be used to assist in understanding the principles of the present and embodiments of the present invention are not intended to be limited to only these specific values.

Figure 1B:
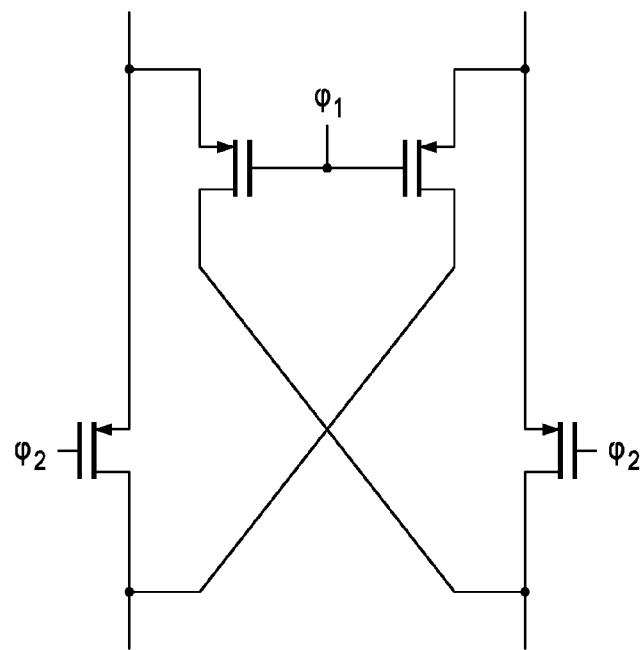
FIG. 1B depicts one example of a chopping switch useful in accordance with the principles of the present invention.

Briefly describing FIG. 1A, an analog input signal 102 is acquired and then chopped by chopping switch 104 at the input of the first transconductor stage 106. There are a wide variety of conventional chopping switches that may be used and one example chopping switch is depicted in FIG. 1B. As is well known, four transistors are arranged so that the inputs are alternately connected to the outputs first in a straight-through arrangement and then in a cross-connected arrangement. The signals $\phi_1$ and $\phi_2$ control the way the transistors connect or cross-connect the inputs and outputs with the result being that the input signal is upconverted to a higher frequency. The frequency of the signals $\phi_1$ and $\phi_2$ is known as the chopping frequency, $f_{chop}$. The transistors of FIG. 1B happen to be depicted as PMOS transistors; however, one of ordinary skill will recognize that NMOS transistors may be substituted as well to accomplish the same chopping function.

The chopped signal from chopping switch 104 is amplified by transconductor 106 and then is chopped again by a second chopper 108 before reaching a second transconductor stage 112. The output from the second chopper 108 is amplified by the transconductor 112. The next step in a conventional ADC is to quantize the output from the transconductor 112 with a quanitizer 114 to produce a digital signal that can be further processed. As is known, the output 116 of the quanitizer is typically fed-back to the transconductor 112 through a switch 118 to assist in the stability of the loop. The quanitizer 114 operates at a clock speed of $f_{clk}$.

The portion of the ADC where the chopped signal and the feedback are combined is known as a summing junction 110 where the voltages of the chopped signal from the second chopper 108 and the feedback signal are alternately summed and subtracted. And while the arrangement of FIG. 1A does partially address flicker noise issues (by upconverting the analog signal at the input of the first transconductor stage 106) it also introduces other disadvantages. In particular, quantization noise from the quanitizer 114 is present at the summing junction along with the analog signal; therefore the summing junction 110 contains frequency components from 0 to $f_{clk}$. Because $f_{chop}$ is performed at less than $f_{clk}$ the operation of combining the voltages at the summing junction 110 occurs at less than the Nyquist rate of $f_{clk}$. Thus, foldover, or aliasing, of quantization noise is introduced; in other words, high frequency components at multiples of $f_{chop}$ get folded to around DC due to this operation at the summing junction 110. Thus, the noise floor of the ADC is increased.

Figure 2:
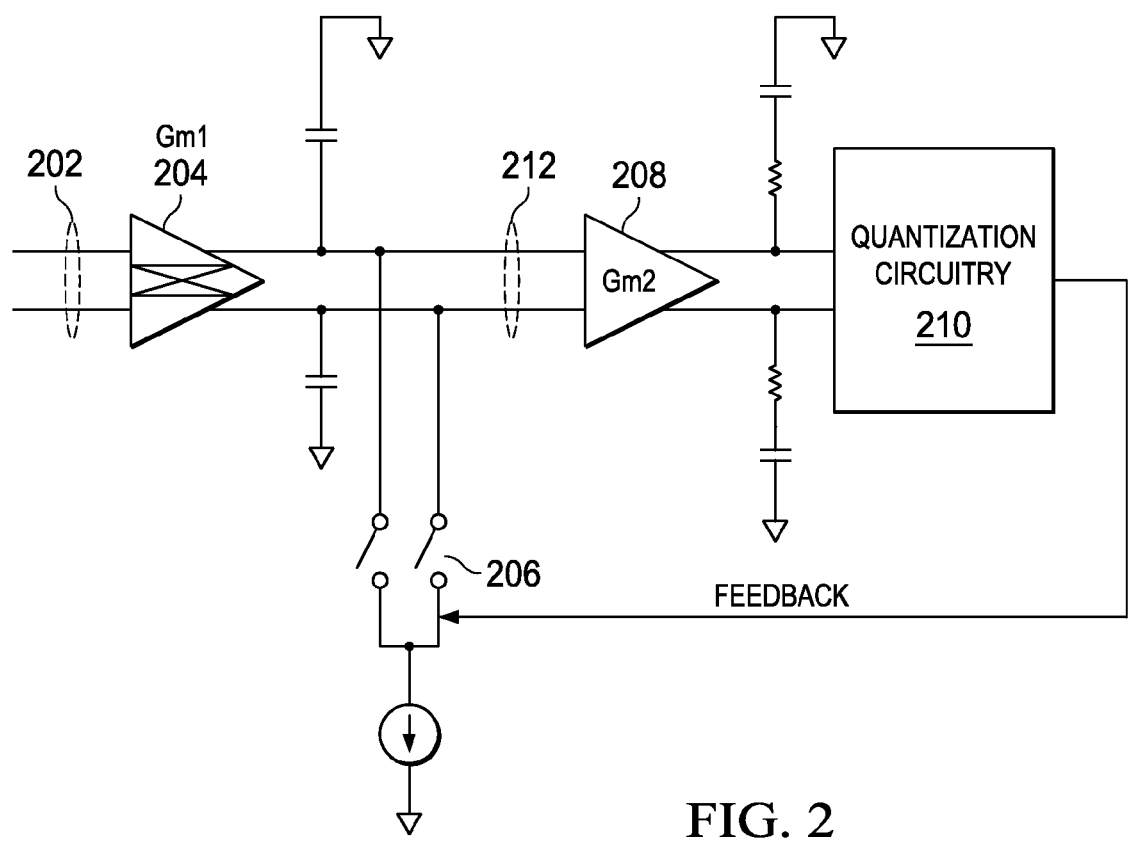
FIG. 2 illustrates an analog to digital converter in accordance with the principles of the present invention.

In accordance with the principles of the present invention, the circuitry of FIG. 2 addresses the aliasing of quantization noise at the summing junction while maintaining low power consumption and without the need for clock boosters. In FIG. 2, a chopping transconductor 204 is utilized that includes both choppers and a transconductor. In particular the outputs of the final chopper within chopping transconductor 204 are connected in a cascode arrangement to Referring to FIG. 2, a differential input signal 202 is applied to the chopping transconductor 204 where it is chopped and amplified. The outputs of the chopping transconductor 204 are connected with the inputs of a second transconductor 208 through a summing junction 212. Subsequent circuitry 210 of the ADC can further shape, amplify, and quantize the outputs of the second transconductor 208. The output of the circuitry 210 is fedback through switches 206 to the summing junction 212. However, the outputs of the chopper within the chopping transconductor 204 are isolated from the quantized signals because of the cascode output arrangement within the chopping transconductor 204. Thus, the chopper does not cause quantization noise folding, or aliasing, at the summing junction 212. As a result, the noise floor of the second transconductor 208 is not raised due to folding of quantization noise.

Figure 3:
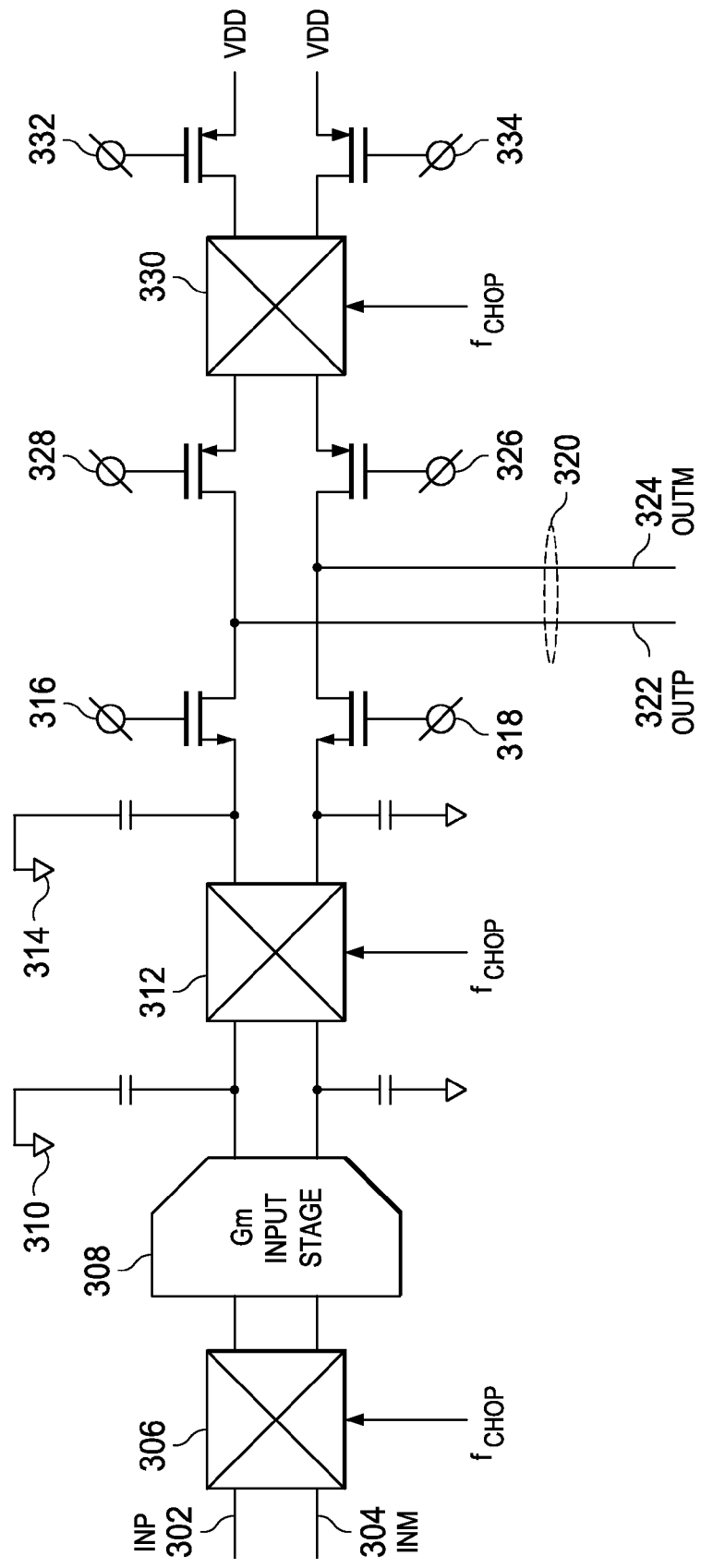
FIG. 3 illustrates details about a chopping transconductor of FIG. 2.

FIG. 3 depicts a detailed view of one example of a chopping transconductor 204. One of ordinary skill will recognize that other functionally equivalent circuits may be used without departing from the scope of the present invention. Differential inputs 302, 304 are chopped by a first chopper 306 and then fed to an transconductor input stage. Because of the chopping, the flicker noise disadvantage has been addressed. The principles of the present invention relate more to the configuration of the outputs of the chopping switches coupled with the summing junction than to the type of transconductor that is used. Thus, the transconductor input stage 308 may be any of a variety of known transconductor types without departing from the scope of the present invention. One particular transconductor that may be utilized is commonly known as a linearized transconductance amplifier which provides relatively stable current independent of fluctuations in operating conditions. Also, as depicted in FIG. 3, some of the signal lines include parasitic capacitances 310 and 314.

The output of the transconductor input stage 308 is fed to chopping switch 312 which is not directly coupled with the outputs 322, 324. These outputs 322, 324 are coupled with the summing junction 320 where quantization noise may be present. Therefore, the outputs of the chopping switch 312 are isolated from the transconductor outputs 322, 324 by respective cascode transistors 316, 318. As shown, for each output of the chopping switch 312, the source of the transistor (316, 318) is coupled with the chopping switch output and the drain is coupled with the transconductor output (322, 324). This arrangement separates the chopping switch 312 from the summing junction 320 where quantization noise is present. Thus, the circuitry to the left of the cascode transistors 316, 318 of FIG. 3 see only the analog signal and its harmonics and do not see quantization noise.

Also included in the example circuit of FIG. 3 is a parallel chopping switch 330 that is coupled with Vdd through transistors 332, 334 and with the transconductor outputs 322, 324 through respective cascode transistors 326, 328. This arrangement is configured to provide the appropriate biases to the cascode transistors 316, 318. While upconverting the flicker noise of transistors 332, 334 similar to the way switch 312 upconverts the flicker noise of the transconductor 308 to higher freqs.

In the example transconductor of FIG. 3, the cascode transistors 316, 318, 328, 326 may be selected to match the transistors of the chopping switches 312, 330. For example, if the chopping switch 312 is implemented using NMOS transistors, then the cascode transistors 316, 318 may also be NMOS transistors. Similarly, if the chopping switch 330 is implemented using PMOS transistors, then the cascode transistors 328, 326 may also be PMOS transistors. Biasing the gates of the cascode transistors can be accomplished using known techniques based on anticipated voltage levels and component characteristics.

Because the switches connect to a cascode node whose bandwidth is very high, the settling time upon a disturbance created by chopping is low. So $f_{chop}$ can be high. This allows the chopping switches to be driven at a relatively high frequency and $f_{chop}$ may for example, be around 12.5 MHz while $f_{clk}$ is about 200 MHz. One of ordinary skill will recognize that other clock speeds a clock speed ratios are contemplated as within the scope of the present invention. Thus, the described topology enables chopping at higher frequencies than conventional topologies. Therefore, it is suitable for structures with a very high flicker noise corner.

The previous description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but are to be accorded the full scope consistent with each claim's language, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. Also, the term "exemplary" is meant to indicate that some information is being provided as an example only as is not intended to mean that that information is somehow special or preferred. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An integrated circuit analog to digital converter comprising:
   A. differential input signals;
   B. differential summing junctions;
   C. first transconductor circuitry having inputs connected with the differential summing junction and having differential outputs;
   D. quantization circuitry having inputs connected to the differential outputs of the first transconductor circuitry and having an output coupled with the differential summing junction; and
   E. chopping transconductor circuitry including:
      i. first chopper circuitry having inputs coupled to the differential input signals and having differential outputs;
      ii. a pair of first cascode transistors, each first cascode transistor having a drain and a source connected between a differential output of the first chopper circuitry and a differential summing junction;
      iii. second chopper circuitry having inputs coupled to a source voltage and having differential outputs; and
      iv. a pair of second cascode transistors, each second cascode transistor having a drain and a source connected between a differential output of the second chopper circuitry and the differential summing junction.

2. The integrated circuit analog to digital converter of claim 1 including a pair of third cascode transistors, each third cascode transistor being connected between the source voltage and an input of the second chopper circuitry.

3. The integrated circuit analog to digital converter of claim 1 in which the chopping transconductor includes:
   A. third chopper circuitry having inputs connected to the differential input signals, and differential outputs; and
   B. transconductor circuitry having differential inputs connected to the differential outputs of the third chopper circuitry, and having differential outputs connected to the differential inputs of the first chopper circuitry.

4. The integrated circuit analog to digital converter of claim 1 in which the first pair of cascode transistors have a source connected with the output of the first chopper circuitry and a drain connected with the summing junction.

* * * * *